US009059363B2

(12) United States Patent
McCann

(10) Patent No.: US 9,059,363 B2
(45) Date of Patent: Jun. 16, 2015

(54) THERMOELECTRIC MATERIALS

(75) Inventor: Patrick John McCann, Norman, OK (US)

(73) Assignee: The Board of Regents of the University of Oklahoma, Norman, OK (US)

(*) Notice: Subject to any disclaimer, the term of this patent is extended or adjusted under 35 U.S.C. 154(b) by 834 days.

(21) Appl. No.: 12/748,531

(22) Filed: Mar. 29, 2010

(65) Prior Publication Data

US 2012/0055528 A1    Mar. 8, 2012

Related U.S. Application Data

(60) Provisional application No. 61/169,218, filed on Apr. 14, 2009.

(51) Int. Cl.
H01L 35/22  (2006.01)
H01L 35/16  (2006.01)
H01L 33/28  (2010.01)
(Continued)

(52) U.S. Cl.
CPC ............... H01L 35/16 (2013.01); *H01L 33/06* (2013.01); *H01L 35/22* (2013.01); *H01L 33/285* (2013.01); *B82Y 20/00* (2013.01); *H01L 29/155* (2013.01); *H01L 29/26* (2013.01); *H01L 35/20* (2013.01); *H01L 35/12* (2013.01); *H01L 35/26* (2013.01)

(58) Field of Classification Search
CPC ......... H01L 35/26; H01L 35/16; H01L 35/12; H01L 35/20; H01L 35/22; H01L 33/285; H01L 33/06; H01L 29/26; H01L 29/155; B82Y 20/00
USPC ........................................................ 136/238
See application file for complete search history.

(56) References Cited

U.S. PATENT DOCUMENTS 5,900,071 A * 5/1999 Harman .................... 136/236.1
6,060,657 A   5/2000 Harman
(Continued)

FOREIGN PATENT DOCUMENTS

EP    1079445 A2   2/2001
EP    2159854 A1   3/2010
(Continued)

OTHER PUBLICATIONS

Ghatak ("Thermoelectric Power in Superlattices of Nonparabolic Semiconductors with Graded Interfaces under Magnetic Quantization"), II Nuovo Cimento, Vo. 15 D, No. 1, pp. 97-112, Sep. 1992.*
(Continued)

*Primary Examiner* — Devina Pillay
(74) *Attorney, Agent, or Firm* — Withrow & Terranova, PLLC

(57) ABSTRACT

A thermoelectric material having a high ZT value is provided. In general, the thermoelectric material is a thin film thermoelectric material that includes a heterostructure formed of IV-VI semiconductor materials, where the heterostructure includes at least one potential barrier layer. In one embodiment, the heterostructure is formed of IV-VI semiconductor materials and includes a first matrix material layer, a potential barrier material layer adjacent to the first matrix material layer and formed of a wide bandgap material, and a second matrix material layer that is adjacent the potential barrier material layer opposite the first matrix material layer. A thickness of the potential barrier layer is approximately equal to a mean free path distance for charge carriers at a desired temperature.

17 Claims, 9 Drawing Sheets

(51) Int. Cl.

| | |
|---|---|
| H01L 35/12 | (2006.01) |
| H01L 35/26 | (2006.01) |
| H01L 33/06 | (2010.01) |
| B82Y 20/00 | (2011.01) |
| H01L 29/15 | (2006.01) |
| H01L 29/26 | (2006.01) |
| H01L 35/20 | (2006.01) |

(56) References Cited

U.S. PATENT DOCUMENTS

| | | |
|---|---|---|
| 6,614,109 B2 | 9/2003 | Cordes et al. |
| 6,818,470 B1 | 11/2004 | Acklin et al. |
| 7,531,739 B1 | 5/2009 | Moczygemba |
| 2003/0099279 A1 | 5/2003 | Venkatasubramanian et al. |
| 2005/0045702 A1 | 3/2005 | Freeman et al. |
| 2005/0139249 A1 | 6/2005 | Ueki et al. |
| 2007/0028956 A1 | 2/2007 | Venkatasubramanian et al. |
| 2009/0277490 A1 | 11/2009 | Chu |

FOREIGN PATENT DOCUMENTS

| | | |
|---|---|---|
| JP | 01235388 A | 9/1989 |
| JP | 2004221109 A | 8/2004 |
| JP | 2006114554 A | 4/2006 |
| JP | 2008305986 A | 12/2008 |
| JP | 2009076603 A | 4/2009 |
| KR | 100984108 B1 | 9/2010 |
| WO | 9844562 A1 | 10/1998 |
| WO | 2007103249 A2 | 9/2007 |

OTHER PUBLICATIONS

Vashaee, "Electronic and thermoelectric transport in semiconductor and metallic superlattices", Feb. 2004, vol. 95 No. 3, pp. 1243-1245.*

Notice of Allowance for U.S. Appl. No. 12/898,218 mailed Mar. 12, 2012, 18 pages.

Harman, T.C., et al, "Quantum Dot Superlattice Thermoelectric Materials and Devices (cover story)", Science, vol. 297, Sep. 27, 2002, pp. 2229-2232.

Heremans, J.P., et al, "Enhancement of Thermoelectric Efficiency in PbTe by Distortion of the Electronic Density of States", Science, vol. 321, Jul. 25, 2008, pp. 554-557.

Zeng, G., et al, "Cross-plane Seebeck coefficient of ErAs:InGaAs/InGaAlAs superlattices", Journal of Applied Physics, vol. 101, Issue 3, Feb. 6, 2007, p. 034502-1, 5 pages.

Bian, Z., et al, "Cross-plane Seebeck coefficient and Lorenz number in superlattices", Physical Review B, vol. 76, Issue 20, Nov. 9, 2007, p. 205311-1, 7 pages.

Zide, J.M.O. et al., "Demonstration of electron filtering to increase the Seebeck coefficient in In0.53Ga0.47As/In0.53Ga0.28Al0.19As superlattices", Physical Review B, vol. 74, Issue 20, Nov. 30, 2006, p. 205335-1, 5 pages.

Elizondo, L.A., et al, "Optically pumped mid-infrared light emitter on silicon", Journal of Applied Physics, vol. 101, Issue 10, May 22, 2007, p. 104504-1, 6 pages.

McCann, P.J., "IV-VI Semiconductors for Mid-infrared Optoelectronic Devices", Mid-Infrared Semiconductor Optoelectronics (book), edited by A. Krier, Springer-Verlog, London, 2006, pp. 237-264.

Li, Y.F., et al, "Transfer of IV-VI multiple quantum well structures grown by molecular beam epitaxy from Si substrates to copper", Thin Solid Films, vol. 488, Issues 1-2, Sep. 22, 2005, pp. 178-184.

McCann, P.J., et al, "Optical pumping of IV-VI semiconductor multiple quantum well materials using a GaSb-based laser with emission at λ=2.5 μm", Journal of Applied Physics, vol. 97, Issue 5, Mar. 2005, p. 053103-1, 4 pages.

Li, Y.F., et al., "Improvement in Heat Dissipation by Transfer of IV-VI Epilayers From Silicon to Copper", IEEE Photonics Technology Letters, vol. 16, No. 11, Nov. 2004, pp. 2433-2435.

Zasavitskii, I.I., et al., "Optical deformation potentials for PbSe and PbTe", Physical Review B, vol. 70, Issue 11, Sep. 8, 2004, p. 115302-1, 10 pages.

McCann, P.J., "IV-VI Semiconductor Materials, Devices, and Applications", State-of-the-Art Program on Compound Semiconductors and Narrow Bandgap Optoelectronic Materials and Devices (book), edited by D. Buckley et al., The Electrochemical Society (ISBN 1-56677-407-1), New Jersey, 2004, p. 218, 16 pages.

Schiessl, U.P., et al., "Lead-Chalcogenide-based Mid-Infrared Diode Lasers", Long-Wavelength Infrared Semiconductor Lasers (book), p. 145, edited by H. K. Choi, Wiley (ISBN 0-471-39200-6), New Jersey, 2004.

Rappl, P.H.O., et al., "Development of a Novel Epitaxial Layer Segmentation Method for Optoelectronic Device Fabrication", IEEE Photonics Technology Letters, vol. 15, Mar. 2003, No. 3, pp. 374-376.

Wu, H.Z., et al., "Experimental determination of deformation potentials and band nonparabolicity parameters for PbSe", Physical Review B, vol. 66, Issue 4, Jul. 9, 2002, p. 045303-1, 7 pages.

Shen, W.Z., et al., "Excitonic line broadening in PbSrSe thin films grown by molecular beam epitaxy", Journal of Applied Physics, vol. 91, No. 6, Mar. 15, 2002, pp. 3621-3625.

Shen, W.Z., et al., "Band gaps, effective masses and refractive indices of PbSrSe thin films: Key properties for mid-infrared optoelectronic device applications", Journal of Applied Physics, vol. 91, Issue 1, Jan. 1, 2002, pp. 192-198.

Shen, W.Z., et al., "Study of band structure in PbSe/PbSrSe quantum wells for midinfrared laser applications", Applied Physics Letters, vol. 79, No. 16, Oct. 15, 2001, pp. 2579-2581.

Jin, J.S., et al.. "Photoelectric properties of PbSe/BaF2/CaF2 films on Si(111) (abstract)," Journal of Infrared and Millimeter Waves, vol. 20, Apr. 2001, pp. 154-156.

Wu, H.Z., et al., "Molecular beam epitaxial growth of IV-VI multiple quantum well structures on Si(111) and BaF2(111) and optical studies of epilayer heating", Journal of Vacuum Science and Technology B, vol. 19, No. 4, Jul./Aug. 2001, pp. 1447-1454.

Wu, H.Z., et al., "Unambiguous observation of subband transitions from longitudinal valley and oblique valleys in IV-VI multiple quantum wells", Applied Physics Letters, vol. 78, No. 15, Apr. 9, 2001, pp. 2199-2201.

McAlister, D.W., et al., "Midinfrared photoluminescence from IV-VI semiconductors grown on silicon", Journal of Applied Physics, vol. 89, No. 6, Mar. 15, 2001, pp. 3514-3516.

Yang, A.L., et al., "Raman Scattering Study of PbSe Grown on (111) BaF2 Substrate", Chinese Physics Letters, vol. 17, No. 8, Aug. 2000, pp. 606-608.

Shi, Z., et al., "IV-VI compound midinfrared high-reflectivity mirrors and vertical-cavity surface-emitting lasers grown by molecular beam epitaxy", Applied Physics Letters, vol. 76, No. 25, Jun. 19, 2000, pp. 3688-3700.

Fang, X.M., et al., "Molecular beam epitaxy of PbSrSe and PbSe/PbSrSe multiple quantum well structures for use in midinfrared light emitting devices", Journal of Vacuum Science and Technology B, vol. 18, Issue 3, May/Jun. 2000, pp. 1720-1723.

Xu, G., et al., "MBE growth of wide band gap Pb1-xSrxSe on Si(111) substrate", Journal of Crystal Growth, vol. 209, Issue 4, Feb. 2, 2000, pp. 763-766.

McAlister, D.W., et al.,"Fabrication of Thin Film Cleaved Cavities Using a Bonding and Cleaving Fixture", IEEE Photonics Technology Letters, vol. 12, Issue 1, Jan. 2000, pp. 22-24.

Li, C.P., et al., "Strain relaxation in PbSnSe and PbSe/PbSnSe layers grown by liquid phase epitaxy on (100)-oriented silicon", Journal of Crystal Growth, vol. 208, Issues 1-4, Jan. 2000, pp. 423-430.

McCann, P.J., et al., "Above-room-temperature continuous wave mid-infrared photoluminescence from PbSe/PbSrSe quantum wells", Applied Physics Letters, vol. 75, No. 23, Dec. 6, 1999, pp. 3608-3610.

Wu, H.Z. et al., "Transfer of PbSe/PbEuSe epilayers grown by MBE on BaF2-coated Si(111)", Thin Solid Films, vol. 352, Issues 1-2, Sep. 8, 1999, pp. 278-282.

McCann, P.J., et al., "IV-VI Semiconductor growth on silicon substrates and new mid-infrared laser fabrication methods,"

(56) References Cited

OTHER PUBLICATIONS

Spectrochimica Acta, Part A: Molecular and Biomolecular Spectroscopy, vol. 55, Sep. 1, 1999, pp. 1999-2005.
Fang, X.M., et al., "Molecular beam epitaxy of periodic BaF2/PbEuSe layers on Si(111)", Journal of Vacuum Science and Technology B, vol. 17, No. 3, May/Jun. 1999, pp. 1297-1300.
Wu, H.Z., et al., "Molecular beam epitaxy growth of PbSe on BaF2-coated Si(111) and observation of the PbSe growth interface", Journal of Vacuum Science and Technology B, vol. 17, No. 3, May/Jun. 1999, pp. 1263-1266.
Sachar, H.K., et al., "Growth and characterization of PbSe and Pb1-xSnxSe on Si(100)", Journal of Applied Physics vol. 85, No. 10, May 15, 1999, pp. 7398-7403.
Fang, X.M., et al., "Molecular beam epitaxial growth of Bi2Se3- and Tl2Se-doped PbSe and PbEuSe on CaF2/Si (111)", Journal of Vacuum Science and Technology B, vol. 16, No. 3, May/Jun. 1998, pp. 1459-1462.
Chao, I.-N., et al., "Growth and characterization of IV-VI semiconductor heterostructures on (100) BaF2", Thin Solid Films, vol. 323, Issue 1-2, Jun. 22, 1998, pp. 126-135.
McCann, P.J., et al., "MBE growth of PbSe/CaF2/Si(111) heterostructures", Journal of Crystal Growth, vols. 175/176, Part 2, May 1, 1997, pp. 1057-1062.
Strecker, B.N., et al., "LPE Growth of Crack-Free PbSe Layers on Si(100) Using MBE-Grown PbSe/BaF2/CaF2 Buffer Layers", Journal of Electronic Materials, vol. 26, No. 5, May 5, 1997, pp. 444-448.
Erchak, A., "PhlatLight: A New Solid-State Light Source", Key Conference on Compound Semiconductors, Key West, FL, Mar. 2-4, 2008, www.luminus.com/stuff/contentmgr/files/0/4faaea3eaca9c134990b0b74f17a3c70/pdf/key_conference_2008_erchak.pdf, accessed Sep. 4, 2008, 21 pages.
Fleurial, J.-P., et al., "Solid-state power generation and cooling micro/nanodevices for distributed system architectures," IEEE 20th International Conference on Thermoelectrics, Beijing, China, Jun. 8-11, 2001, pp. 24-29.
Caylor, J.C., et al., "Enhanced thermoelectric performance in PbTe-based superlattice structures from reduction of lattice thermal conductivity", Applied Physics Letters, vol. 87, No. 2, Jul. 8, 2005, p. 023105-1, 3 pages.
Mahan, G.D., et al, "Multilayer Thermionic Refrigeration", Physical Review Letters, vol. 80, No. 18, May 4, 1998, pp. 4016-4019.
Kucherov, Y., et al., "Importance of barrier layers in thermal diodes for energy conversion," Journal of Applied Physics, vol. 97, Issue 9, Apr. 14, 2005, p. 094902-1, 8 pages.
Kim, W., et al., "Cross-plane lattice and electronic thermal conductivities of ErAs:InGaAs/InGaAlAs superlattices", Applied Physics Letters, vol. 88, No. 24, Jun. 13, 2006, p. 242107-1, 3 pages.
McCann, P.J., et al., "Optical properties of ternary and quaternary IV-VI semiconductor layers on (100) BaF2 substrates", Applied Physics Letters, vol. 66, No. 11, Jan. 2, 1995, pp. 1355-1357.
McCann, P.J., et al., "Growth and characterization of thallium- and gold doped PbSe0.78Te0.22 layers lattice matched with BaF2 substrates", Applied Physics Letters, vol. 65, No. 17, Oct. 24, 1994, pp. 2185-2187.
McCann, P.J., et al., "The role of graphite boat design in liquid phase epitaxial growth of PbSe0.78Te0.22 on BaF2", Journal of Crystal Growth, vol. 141, Issues 3-4, Aug. 2, 1994, pp. 376-382.
McCann, P.J., et al., "Liquid phase epitaxy growth of Pb1-xSnxSe1-yTey alloys lattice matched with BaF2", Journal of Applied Physics, vol. 75, No. 2, Jan. 15, 1994, pp. 1145-1150.
McCann, P.J., et al., "Growth of PbSe0.78Te0.22 lattice-matched with BaF2", Thin Solid Films, vol. 227, Issue 2, May 10, 1993, pp. 185-189.
McCann, P.J., et al., "Auger Electron Spectroscopic Analysis of Barium Fluoride Surfaces Exposed to Selenium Vapor", Journal of Electronic Materials, vol. 20, No. 11, Nov. 1991, pp. 915-920.
McCann, P.J., et al., "Phase equilibria and liquid phase epitaxy growth of PbSnSeTe lattice matched to PbSe", Journal of Applied Physics, vol. 62, No. 7, Oct. 1, 1987, pp. 2994-3000.
Elizondo, L.A., "Low-Dimensional IV-VI Semiconductor Materials", Ph.D. Dissertation, School of Electrical and Computer Engineering, University of Oklahoma Graduate College, 2008, 273 pages.
Williams, B.S., et al., "Terahertz quantum cascade lasers with double-resonant-phonon depopulation", Applied Physics Letters, vol. 88, No. 26, Jun. 2006, p. 261101-1, 3 pages.
Harman, T.C. et al., "High electrical power density from PbTe-based quantum-dot superlattice unicouple thermoelectric devices", Applied Physics Letters, vol. 88, No. 24, Jun. 2006, p. 243504-1, 3 pages.
Martin, J., et al., "Enhanced Seebeck coefficient through energy-barrier scattering in PbTe nanocomposites," Physical Review B, vol. 79, Issue 11, Mar. 13, 2009, p. 115311-1, 5 pages.
Taylor, P.J., et al., "New Technology for Microfabrication and Testing of a Thermoelectric Device for Generating Mobile Electrical Power," ARL-TR-4480, Army Research Laboratory, Adelphi, Maryland, Jun. 2008, 18 pages.
International Search Report for PCT/US2010/051457 mailed May 13, 2011, 8 pages.
McCann, P.J., et al., "Liquid phase epitaxial growth of PbSe on (111) and (100) BaF2", Journal of Crystal Growth, vol. 114, Issue 4, Dec. 1, 1991, pp. 687-692.
Vineis, C.J. et al., "Carrier concentration and temperature dependence of the electronic transport properties of epitaxial PbTe and PbTe/Se nanodot superlattices," Physical Review B, vol. 77, Jun. 2008, 14 pages.
Harman, T.C. et al., "Thermoelectric quantum-dot superlattices with high ZT," Journal of Electronic Materials, vol. 29, No. 1, Jan. 2000, 4 pages.
Harman, T.C. et al., "PbTe/Te superlattice structures with enhanced thermoelectric figures of merit," Journal of Electronic Materials, vol. 28, No. 1, Jan. 1999, 4 pages.
Wu, K.H. et al., "Improvement of spatial resolution for local Seeback coefficient measurements by deconvolution algorithm," Review of Scientific Instruments, vol. 80, Oct. 2009, 8 pages.

\* cited by examiner

THERMOELECTRIC MATERIALS

RELATED APPLICATIONS

This application claims the benefit of provisional patent application Ser. No. 61/169,218, filed Apr. 14, 2009, the disclosure of which is hereby incorporated herein by reference in its entirety.

FIELD OF THE DISCLOSURE

The present disclosure relates to thermoelectric devices and more specifically relates to thermoelectric materials for use in thermoelectric devices.

BACKGROUND

Technologies based upon semiconductor materials and devices have a remarkable track record of commercial achievement. Silicon-based solid state electronics have given us computing technology that has doubled in performance every two years (Moore's Law) for over forty years. Additionally, compound semiconductor optoelectronics, mostly Gallium Arsenide (GaAs) and Indium Phosphide (InP) based III-V semiconductor laser diodes, have given us communications technology that doubles the data coming out of an optical fiber every nine months (Butter's Law of Photonics). Semiconductor technology is now being applied to energy and energy efficiency. Solar cell devices based on silicon and other semiconductor materials have recently experienced significant commercial success. However, it is widely recognized that there is little room left for significant improvement in solar cell power production efficiencies. In other words, there appears to be no equivalent opportunity for a Moore's Law type of improvement with solar cells. By contrast, thermoelectric materials for power generation from heat sources are increasingly being recognized as having the potential for a Moore's Law type of sustained performance improvement in the clean technology area.

In general, thermoelectric materials can be used to form thermoelectric generators and thermoelectric coolers. More specifically, FIG. 1A illustrates a traditional two-leg thermoelectric generator (TEG) 10. As illustrated, the TEG 10 includes a bulk-shaped N-type thermoelectric material 12, a bulk-shaped P-type thermoelectric material 14, a top conductive metal layer 16, and a bottom conductive metal layer 18. In order to generate power, heat is applied to the top conductive metal layer 16, thereby creating a heat differential between the top conductive metal layer 16 and the bottom conductive metal layer 18. This heat differential induces electrical current flow in the TEG 10 as illustrated. The electrical current flow through the N-type thermoelectric material 12 and the P-type thermoelectric material 14 is parallel to the direction of heat transference in the TEG 10. The induced electrical current flow supplies power to a resistive load 20.

FIG. 1B illustrates a traditional two-leg thermoelectric cooler (TEC) 22. Like the TEG 10, the TEC 22 includes a bulk-shaped N-type thermoelectric material 24, a bulk-shaped P-type thermoelectric material 26, a top conductive metal layer 28, and a bottom conductive metal layer 30. In order to effect thermoelectric cooling, an electrical current is applied to the TEC 22 as shown. The direction of current transference in the N-type thermoelectric material 24 and the P-type thermoelectric material 26 is parallel to the direction of heat transference in the TEC 22. As a result, cooling occurs at the top conductive metal layer 28 by absorbing heat at the top surface of the TEC 22 and releasing heat at the bottom surface of the TEC 22.

The primary figure of merit for thermoelectric materials is ZT, where ZT is defined as:

$$ZT = S^2 \sigma T/k,$$

where S is the Seebeck coefficient of the thermoelectric material, $\sigma$ is the electrical conductivity of the thermoelectric material, k is the thermal conductivity of the thermoelectric material, and T is the temperature in Kelvins. Thus, a good thermoelectric material will have low thermal conductivity, high electrical conductivity, and a high Seebeck coefficient. Presently, commercial thermoelectric materials have ZT values of around 1.0. However, ZT values of 3.0 or higher are desired. As such, there is a need for a thermoelectric material having a high ZT value.

SUMMARY

A thermoelectric material having a high ZT value is provided. In general, the thermoelectric material is a thin film thermoelectric material that includes a heterostructure formed of IV-VI semiconductor materials, where the heterostructure includes at least one potential barrier layer. In one embodiment, the heterostructure is formed of IV-VI semiconductor materials and includes a first matrix material layer, a potential barrier material layer adjacent to the first matrix material layer and formed of a wide bandgap material, and a second matrix material layer that is adjacent the potential barrier material layer opposite the first matrix material layer. A thickness of the potential barrier layer is approximately equal to a mean free path distance for charge carriers at a desired temperature. In addition, a thickness of the second matrix material layer may be equal to or greater than three times the thickness of the potential barrier material layer in order to enable thermal relaxation of charge carriers. Still further, a Fermi energy of the thermoelectric material may be at or near a barrier height of the potential barrier material layer in order to increase cross-plane effective carrier density and thus the ZT value of the thermoelectric material.

In another embodiment, the heterostructure is formed of IV-VI semiconductor materials and includes an initial matrix material layer and an alternating series of multiple potential barrier layers formed of a wide bandgap semiconductor material and multiple matrix material layers formed of a semiconductor material. For each potential barrier material layer, a thickness of the potential barrier material layer is approximately equal to a mean free path for charge carriers at a corresponding temperature in a temperature gradient for the thermoelectric material. The temperature gradient is an expected temperature gradient across the thermoelectric material when incorporated into a thermoelectric device. In addition, a thickness of each matrix material layer in the alternating series of potential barrier material layers and matrix material layers, or a subset thereof, may be equal to or greater than three times the thickness of an immediately preceding potential barrier layer in the alternating series of potential barrier material layers and matrix material layers in order to allow thermal relaxation of charge carriers. Still further, a Fermi energy of the thermoelectric material may be at or near a barrier height of the potential barrier material layers in order to increase cross-plane effective carrier density and thus the ZT value of the thermoelectric material.

In another embodiment, the heterostructure is formed of IV-VI semiconductor materials and includes a heterostructure including one or more matrix material layers formed of a semiconductor material and one or more potential barrier material layers formed of a wide bandgap semiconductor material. A Fermi energy of the thermoelectric material is at or near a barrier height of the one or more potential barrier material layers in order to increase cross-plane effective carrier density and thus the ZT value of the thermoelectric material.

In another embodiment, the heterostructure is formed of IV-VI semiconductor materials and includes an initial matrix material layer and an alternating series of one or more potential barrier material layers formed of a wide bandgap semiconductor material and one or more matrix material layers formed of a semiconductor material. A thickness of each of at least a subset of the matrix material layers in the alternating series of potential barrier material layers and matrix material layers is greater than or equal to three times a thickness of the immediately preceding potential barrier material layer in the alternating series of potential barrier material layers and matrix material layers with respect to charge carrier flow.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 4:
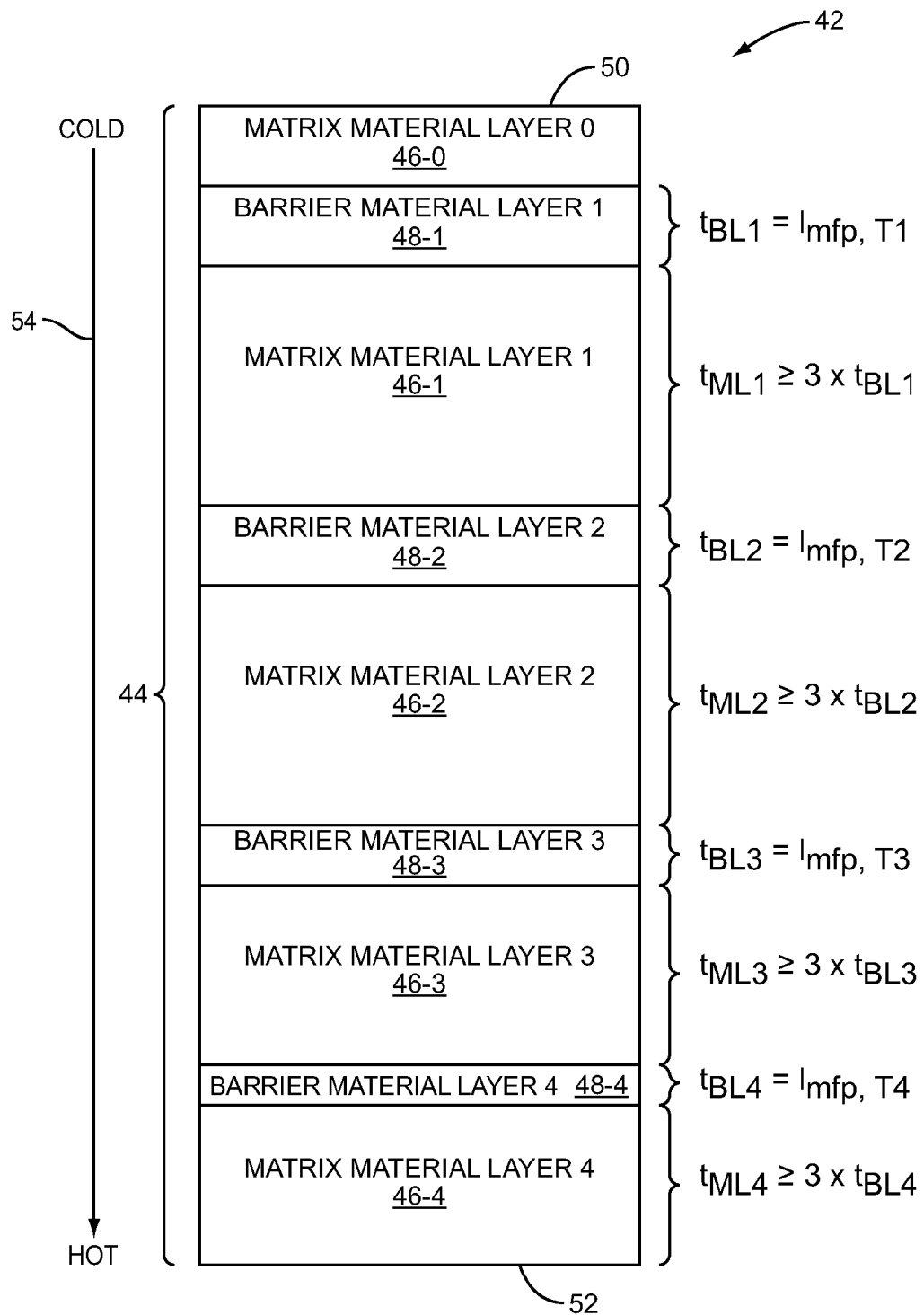
Figure 5:
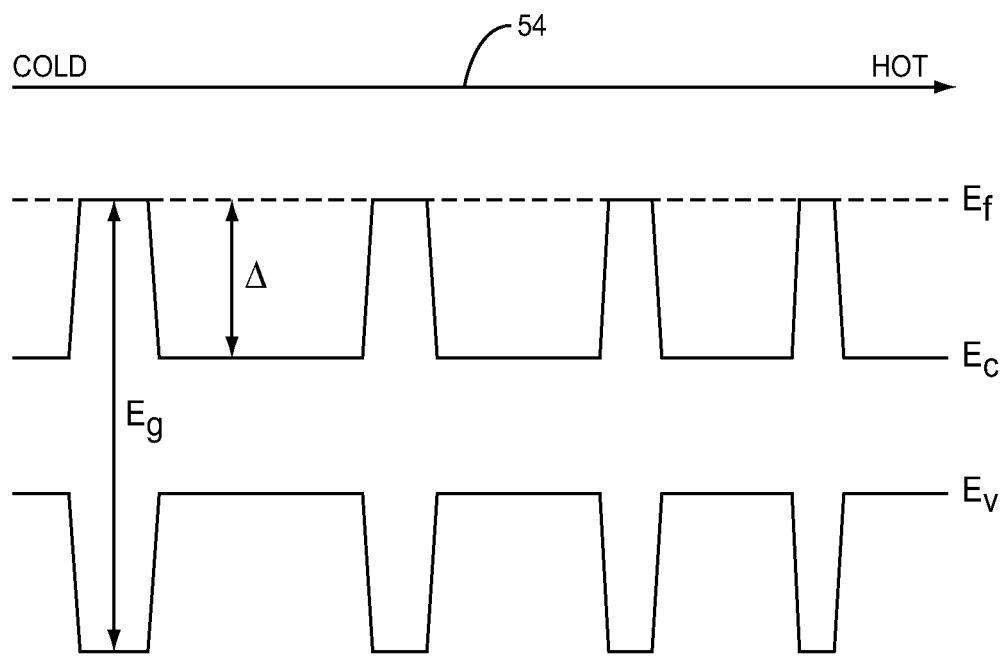
Figure 6:
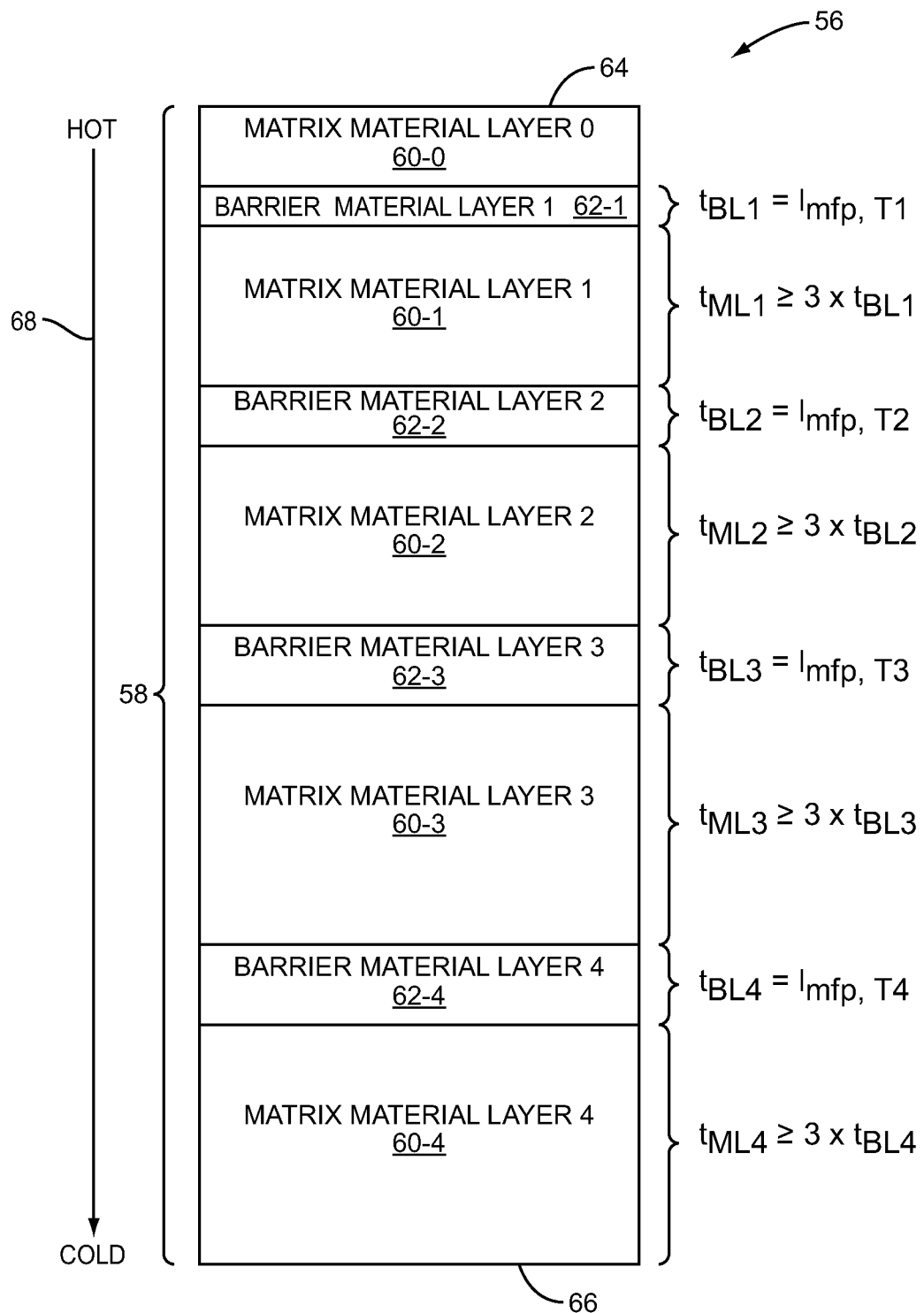
Figure 7:
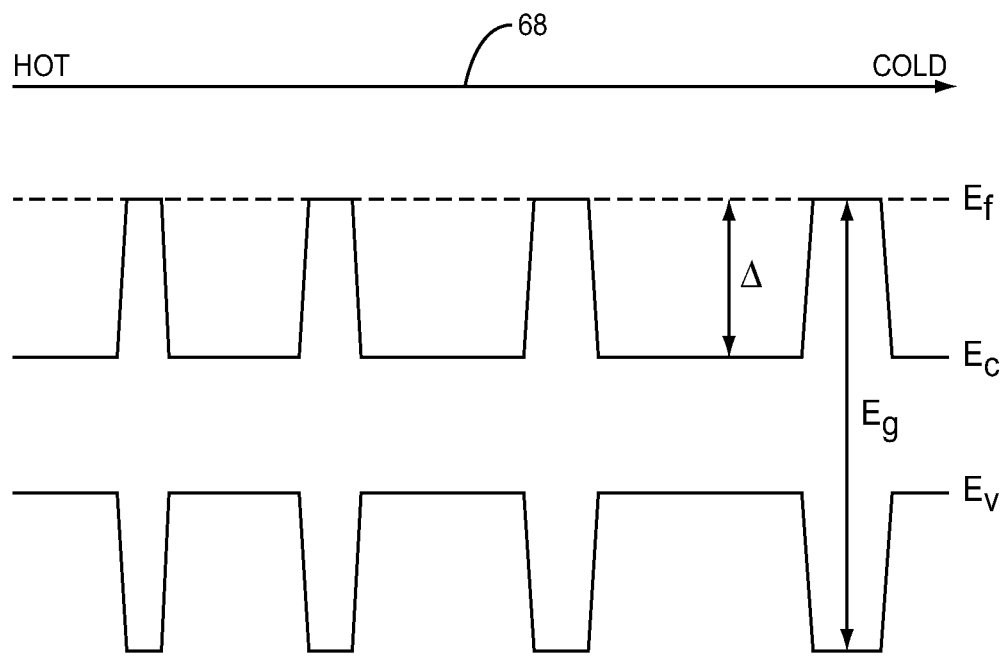

FIG. 4 illustrates a thin film thermoelectric material including a heterostructure formed of IV-VI semiconductor materials, wherein the heterostructure includes multiple potential barrier material layers having thicknesses that are approximately equal to mean free paths of charge carriers for corresponding temperatures in an expected temperature gradient across the thin film thermoelectric material when incorporated into a Thermoelectric Cooler (TEC) according to one embodiment of the present disclosure;

FIG. 5 is an energy band diagram for the heterostructure of the thin film thermoelectric material of FIG. 4, wherein a Fermi energy of the heterostructure is at or near a barrier height of the potential barrier material layers according to one embodiment of the present disclosure;

FIG. 6 illustrates a thin film thermoelectric material including a heterostructure formed of IV-VI semiconductor materials, wherein the heterostructure includes multiple potential barrier material layers having thicknesses that are approximately equal to mean free paths of charge carriers for corresponding temperatures in an expected temperature gradient across the thin film thermoelectric material when incorporated into a Thermoelectric Generator (TEG) according to one embodiment of the present disclosure;

FIG. 7 is an energy band diagram for the heterostructure of the thin film thermoelectric material of FIG. 6, wherein a Fermi energy of the heterostructure is at or near a barrier height of the potential barrier material layers according to one embodiment of the present disclosure; and FIGS. 8A through 8G graphically illustrate a process for fabricating a two-leg or multi-leg thermoelectric device including thin film thermoelectric material layers according to one embodiment of the present disclosure.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1A:
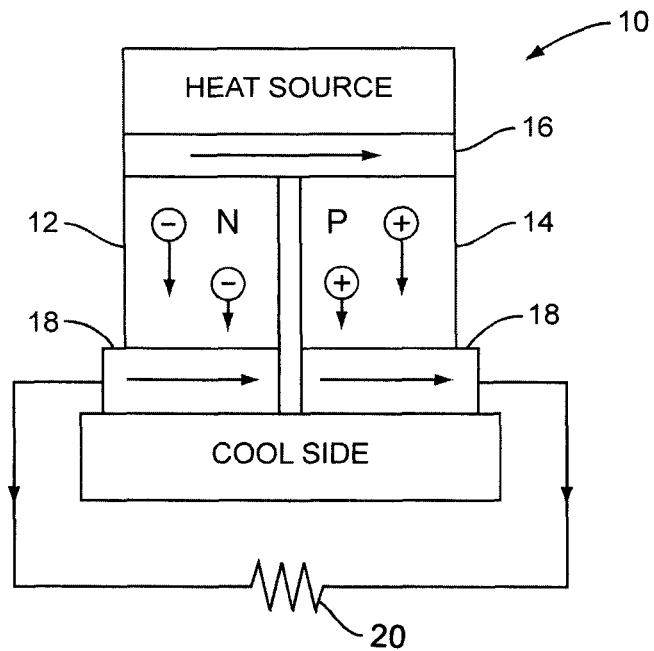
FIGS. 1A and 1B illustrate exemplary thermoelectric devices according to the prior art.
Figure 1B:
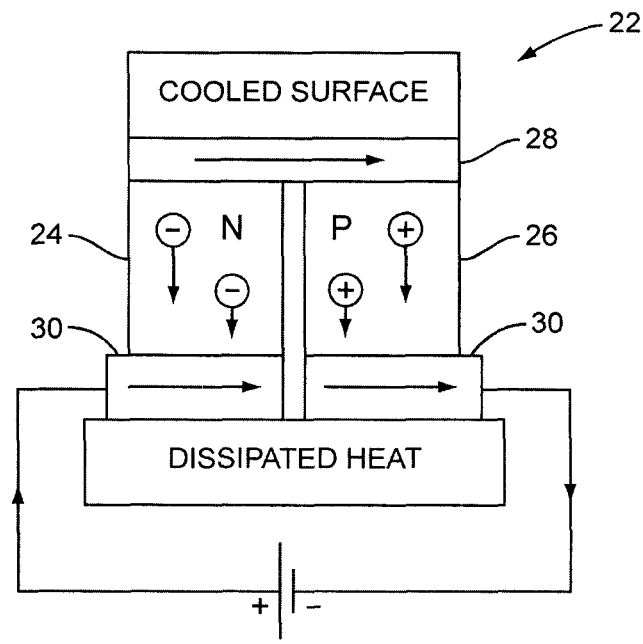
Figure 2:
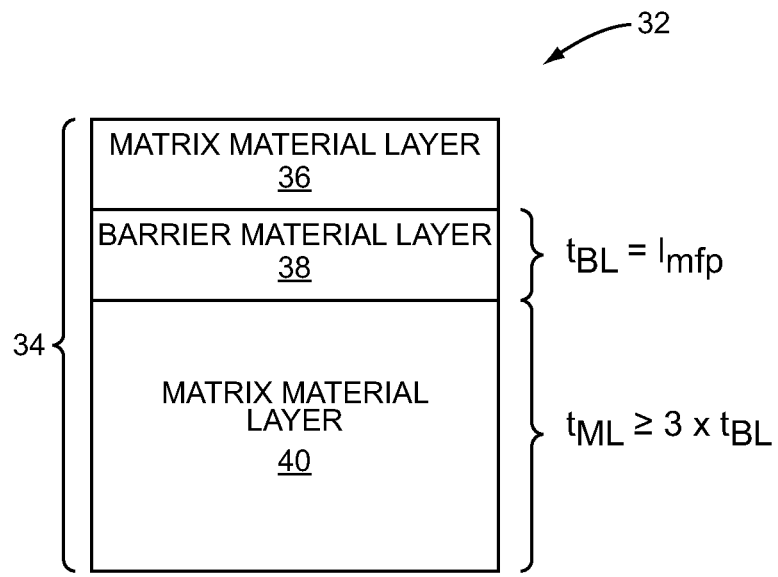
FIG. 2 illustrates a thin film thermoelectric material including a heterostructure formed of IV-VI semiconductor materials, wherein the heterostructure includes a potential barrier material layer having a thickness approximately equal to a mean free path of charge carriers for a desired temperature according to one embodiment of the present disclosure.

FIG. 2 illustrates a thin film thermoelectric material 32 (hereinafter "thermoelectric material 32") having a high ZT value according to one embodiment of the present disclosure. The thermoelectric material 32 includes a heterostructure 34 formed of Group IV-VI semiconductor materials. More specifically, in this embodiment, the heterostructure 34 includes a first matrix material layer 36, a potential barrier material layer 38 (hereinafter "barrier material layer 38") that is adjacent to the first matrix material layer 36, and a second matrix material layer 40 that is adjacent to the barrier material layer 38 opposite the first matrix material layer 36. In order to operate as a potential barrier, the barrier material layer 38 has a bandgap that is greater than a bandgap of the matrix material layers 36 and 40, and is therefore referred to herein as being formed of a wide bandgap material. A resulting barrier height of the barrier material layer 38 is preferably in the range of and including 25 milli-electron-Volts (meV) to 100 meV, but is not limited thereto. In the preferred embodiment, the first and second matrix material layers 36 and 40 are PbSnSe, and the barrier material layer 38 is PbSe. However, other IV-VI semiconductor materials such as, but not limited to, PbTe, PbSnTe, and related alloys may be used. For example, in one alternative embodiment, the first and second matrix material layers 36 and 40 are PbSnTe, and the barrier material layer 38 is PbTe. In another alternative embodiment, the first and second matrix material layers 36 and 40 are PbSnSeTe, and the barrier material layer 38 is PbSe. Further, the PbSnSeTe/PbSe combination can be specified as lattice-matched, a feature that will help to improve cross plane charge carrier conduction. In operation, energetic thermally excited electrons, or holes depending on the conductivity type of the thermoelectric material 32, are selectively "skimmed" off and transported from the first matrix material layer 36 across the barrier material layer 38 into the second matrix material layer 40. The first matrix material layer 36 operates as an emitter of charge carriers, and the second matrix material layer 40 operates as a collector of charge carriers.

In this embodiment, a thickness ($t_{BL}$) of the barrier material layer 38 is approximately equal to, or on the order of, a mean free path for charge carriers (i.e., electrons or holes) in the barrier material layer 38 between scattering events at a desired temperature. In one embodiment, the desired temperature is room temperature (i.e., 300 Kelvins). However, the desired temperature may be any desired temperature in which a thermoelectric device formed of the thermoelectric material 32 is to be operated. By letting the thickness ($t_{BL}$) of the barrier material layer 38 be approximately equal to the mean free path for charge carriers between scattering events at the desired temperature, ballistic transport of charge carriers from the first matrix material layer 36 through the barrier material layer 38 and into the second matrix material layer 40 is enabled, thereby increasing the Seebeck coefficient of the thermoelectric material 32 and thus the ZT value of the thermoelectric material 32.

If the thermoelectric material 32 is N-type, the mean free path for electrons is defined as:

$$l_{mfp}^e = \frac{\mu_n}{q}\sqrt{3kTm_e^*},\quad \text{(Eqn. 1)}$$

where $l_{mfp}^e$ is the mean free path for electrons in the barrier material layer 38, $\mu_n$ is the electron mobility of the barrier material layer 38, q is the charge of an electron, k is Boltzmann's constant, T is temperature in Kelvins, and $m_e^*$ is electron mass. As such, if the thermoelectric material 32 is N-type, the thickness ($t_{BL}$) of the barrier material layer 38 is preferably defined as:

$$t_{BL} \cong l_{mfp}^e = \frac{\mu_n}{q}\sqrt{3kTm_e^*}.\quad \text{(Eqn. 2)}$$

Similarly, if the thermoelectric material 32 is P-type, the mean free path for holes is defined as:

$$l_{mfp}^h = \frac{\mu_p}{q}\sqrt{3kTm_h^*}\quad \text{(Eqn. 3)}$$

where $l_{mfp}^h$ is the mean free path for holes in the barrier material layer 38, $\mu_p$ is the electron mobility of the barrier material layer 38, q is the charge of an electron, k is Boltzmann's constant, T is temperature in Kelvins, and $m_h^*$ is hole mass. As such, if the thermoelectric material 32 is P-type, the thickness ($t_{BL}$) of the barrier material layer 38 is preferably defined as:

$$t_{BL} \cong l_{mfp}^h = \frac{\mu_p}{q}\sqrt{3kTm_h^*}.\quad \text{(Eqn. 4)}$$

As an example, in the preferred embodiment, the barrier material layer 38 is PbSe. For this example, assume that the desired temperature is room temperature (i.e., 300 Kelvins). As such, using Equation 2, the mean free path for electrons in lightly doped PbSe at room temperature is 16.9 nanometers (nm) as shown in the following table:

| $N_d$ (cm$^{-3}$) | $\mu_n$ (cm$^2$/vs) | $m_e^*$ (x $m_o$) | $l_{mfp}^e$ (nm) |
|---|---|---|---|
| $1 \times 10^{18}$ | 1,000 | 0.1 | 16.9 |

In a similar manner, using Equation 4, the mean free path for holes in lightly doped PbSe at room temperature is 105 nm as shown in the following table:

| $N_a$ (cm$^{-3}$) | $M_p$ (cm$^2$/vs) | $m_h^*$ (x $m_o$) | $l_{mfp}^h$ (nm) |
|---|---|---|---|
| $2 \times 10^{17}$ | 600 | 0.1 | 10.1 |

Thus, in this example, the thickness of the barrier material layer 38 is approximately 16.9 nm if the thermoelectric material 32 is N-type and approximately 10.1 nm if the thermoelectric material 32 is P-type. Note, however, that the mean free path of charge carriers in PbSe can range from tens of nanometers at high temperatures to hundreds of nanometers at cryogenic temperatures.

In addition, in this embodiment, a thickness ($t_{ML}$) of the second matrix material layer 40 is greater than or equal to three times the thickness of the barrier material layer 38. By letting the thickness ($t_{ML}$) of the second matrix material layer 40 be greater than or equal to three times the thickness ($t_{BL}$) of the barrier material layer 38, charge carriers passing from the first matrix material layer 36 through the barrier material layer 38 and into the second matrix material layer 40 are allowed to relax thermally by scattering at least three times. In other words, the charge carriers are allowed to reach a thermal equilibrium level. Note that the thickness of the first matrix material layer 36 is not relevant with respect to allowing the charge carriers to relax thermally. As such, the thickness of the first matrix material layer 36 may be any desired thickness.

Figure 3:
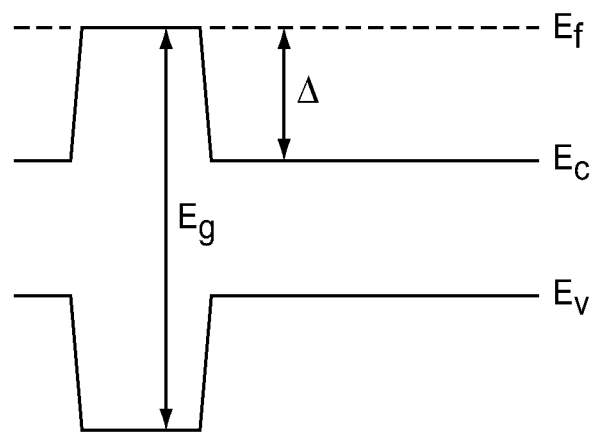
FIG. 3 is an energy band diagram for the heterostructure of the thin film thermoelectric material of FIG. 2, wherein a Fermi energy of the heterostructure is at or near a barrier height of the potential barrier material layer according to one embodiment of the present disclosure.

FIG. 3 is an exemplary energy band diagram for the thermoelectric material 32 of FIG. 2 according to one embodiment of the present disclosure. In this example, the thermoelectric material 32 is N-type. However, this discussion is also applicable for the case where the thermoelectric material 32 is P-type. In this embodiment, alloying of the barrier material layer 38, doping of the first and second matrix material layers 36 and 40, or both is selected or controlled such that a Fermi energy ($E_f$) of the thermoelectric material 32 is at or near a barrier height ($\Delta$) of the barrier material layer 38. Since the Fermi energy ($E_f$) defines an energy level at which the Fermi-Dirac probability distribution function is 0.5 (i.e., the energy level above which half of the charge carriers are expected to reside), by increasing the Fermi energy ($E_f$) such that it is at or near the barrier height ($\Delta$), there are more electrons at or above the barrier height ($\Delta$). As a result, cross-plane effective carrier density is increased, which in turn increases the ZT value for the thermoelectric material 32. The Fermi energy ($E_f$) may be approximately equal to the barrier height ($\Delta$) or within a range of values near the barrier height ($\Delta$).

For example, in the preferred embodiment, the first and second matrix material layers 36 and 40 are PbSe, and the barrier material layer 38 is PbSnSe. The barrier height ($\Delta$) may be controlled via the Sn content. More specifically, increasing the Sn content increases the barrier height ($\Delta$). In addition or alternatively, the Fermi energy ($E_f$) may be controlled via doping of the IV-VI material by adding an impurity such as, for example, Bismuth. Increasing the doping level moves the Fermi energy ($E_f$) more into the conduction band (N-type) or more into the valence band (P-type). The Sn content and/or the doping can be controlled to set the Fermi energy ($E_f$) at or near the barrier height ($\Delta$). In this example, the Fermi energy ($E_f$) may be set approximately equal to the barrier height ($\Delta$), be within a range of the barrier height ($\Delta$) plus or minus approximately 0.1*kT (where k is Boltzmann's constant and T is temperature in Kelvins), be within a range of the barrier height ($\Delta$) minus approximately 0.1*kT, or the like. For example, at room temperature with a thermal energy (kT) of 26 meV, the Fermi energy ($E_f$) may be controlled to be the barrier height ($\Delta$)±3 meV.

FIG. 4 illustrates a thin film thermoelectric material 42 (hereinafter "thermoelectric material 42") having a high ZT value according to another embodiment of the present disclosure. The thermoelectric material 42 includes a heterostructure 44 formed of Group IV-VI semiconductor materials. The heterostructure 44 includes an alternating series of matrix material layers 46 and potential barrier material layers 48 (hereinafter "barrier material layers 48"). In order to operate as a potential barrier, the barrier material layers 48 have a bandgap that is greater than a bandgap of the matrix material layers 46, and are therefore referred to herein as being formed of a wide bandgap material. A resulting barrier height of the barrier material layers 48 is preferably in the range of and including 25 meV to 100 meV, but is not limited thereto. In the preferred embodiment, the matrix material layers 46 are PbSnSe, and the barrier material layers 48 are PbSe. However, other Group IV-VI semiconductor materials may be used. In this exemplary embodiment, the heterostructure 44 includes an initial matrix material layer 46-0 and an alternating series of barrier material layers 48-1 through 48-4 and matrix material layers 46-1 through 46-4. Note that in this exemplary embodiment, there are five matrix material layers 46-0 through 46-4, which are generally referred to herein as matrix material layers 46, and four barrier material layers 48-1 through 48-4, which are generally referred to herein as barrier material layers 48. However, the heterostructure 44 is not limited thereto. The heterostructure 44 may include any number of alternating matrix material layers 46 and barrier material layers 48 as long as the heterostructure 44 includes at least two barrier material layers 48.

In this embodiment, the thermoelectric material 42 is designed for operation in a Thermoelectric Cooler (TEC) such that, during operation, a top surface 50 of the thermoelectric material 42 will be cold and a bottom surface 52 of the thermoelectric material 42 will be hot. As a result, the thermoelectric material 42 will have, or will experience, a corresponding temperature gradient 54. Thicknesses of the barrier material layers 48 are approximately equal to, or on the order of, the mean free paths of charge carriers between scattering events at corresponding temperatures in the temperature gradient 54 for the thermoelectric material 42. By letting the thicknesses of the barrier material layers 48 be approximately equal to the mean free paths for charge carriers between scattering events at the corresponding temperatures in the temperature gradient 54 of the thermoelectric material 42, ballistic transport of charge carriers across the barrier material layers 48 is enabled, thereby increasing the Seebeck coefficient of the thermoelectric material 42.

If the thermoelectric material 42 is N-type, the thickness ($t_{BLi}$) of the ith barrier material layer 48 in the thermoelectric material 42 is preferably defined as:

$$t_{BLi} \cong l_{mfp}^{e} = \frac{\mu_n}{q}\sqrt{3kT_i m_e^*}$$ (Eqn. 5)

where $T_i$ is the temperature (in Kelvins) in the temperature gradient 54 at a position of the ith barrier material layer 48 in the thermoelectric material 42, $\mu_n$ is the electron mobility of the barrier material layer 48 at temperature $T_i$, q is the charge of an electron, k is Boltzmann's constant, and m: is electron mass. Similarly, if the thermoelectric material 42 is P-type, the thickness ($t_{BLi}$) of the ith barrier material layer 48 in the thermoelectric material 42 is preferably defined as:

$$t_{BLi} \cong l_{mfp}^{h} = \frac{\mu_p}{q}\sqrt{3kT_i m_h^*}$$ (Eqn. 6)

where $T_i$ is the temperature (in Kelvins) in the temperature gradient 54 at a position of the ith barrier material layer 48 in the thermoelectric material 42, $\mu_p$ is the electron mobility of the barrier material layer 48 at temperature $T_i$, q is the charge of an electron, k is Boltzmann's constant, and $m_h^*$ is hole mass.

Depending on the material quality that can be obtained and the absolute temperatures in the thermoelectric material 42, the thicknesses of the barrier material layers 48 designed for high temperatures may be as thin as a few nanometers while barrier material layers 48 designed for low temperatures may be as thick as a 100 nanometers or more.

In addition, in this embodiment, a thickness of each of the matrix material layers 46 that is downstream of an adjacent barrier material layer 48 in the direction of charge carrier flow is greater than or equal to three times the thickness of the immediately preceding barrier material layer 48. More specifically, in this embodiment, the thickness ($t_{ML1}$) of the matrix material layer 46-1 is greater than or equal to three times the thickness ($t_{BL1}$) of the barrier layer 48-1, the thickness ($t_{ML2}$) of the matrix material layer 46-2 is greater than or equal to three times the thickness ($t_{BL2}$) of the barrier layer 48-2, the thickness ($t_{ML3}$) of the matrix material layer 46-3 is greater than or equal to three times the thickness ($t_{BL3}$) of the barrier layer 48-3, and the thickness ($t_{ML4}$) of the matrix material layer 46-4 is greater than or equal to three times the thickness ($t_{BL4}$) of the barrier layer 48-4. By letting the thicknesses ($t_{ML1}$ through $t_{ML4}$) of the matrix material layers 46-1 through 46-4 be greater than or equal to three times the thicknesses ($t_{BL1}$ through $t_{BL4}$) of the corresponding barrier material layers 48-1 through 48-4, charge carriers are allowed to relax thermally by scattering at least three times after passing through the barrier material layers 48-1 through 48-4. In other words, the charge carriers are allowed to reach a thermal equilibrium level. Note that the thickness of the matrix material layer 46-0 is not relevant with respect to allowing the charge carriers to relax thermally. As such, the thickness of the matrix material layer 46-0 may be any desired thickness.

It should be noted that in one embodiment, incorporation of quantum wells in the collector layers (e.g., the matrix material layers 46-1 through 46-4) can facilitate capture and thermalization of electrons due to electrophonon resonance associated with the subband degeneracy splitting effect. Quantum well incorporation can be useful since it would allow the collector layers to be thinner thus enabling more barrier material layers 48 with a given device structure thickness. A further benefit is that incorporating periodic quantum well layers will decrease lattice thermal conductivity because of increased phonon scattering associated with Umklapp processes. These as well as other variations and combinations of similar material design concepts are considered within the scope of this disclosure.

FIG. 5 is an exemplary energy band diagram for the thermoelectric material 42 of FIG. 4 according to one embodiment of the present disclosure. In this example, the thermoelectric material 42 is N-type. However, this discussion is also applicable for the case where the thermoelectric material 42 is P-type. In this embodiment, alloying of the barrier material layers 48, doping of the matrix material layers 46, or both is selected or controlled such that a Fermi energy ($E_f$) of the thermoelectric material 42 is at or near a barrier height (Δ) of the barrier material layers 48. Since the Fermi energy ($E_f$) defines an energy level at which the Fermi-Dirac probability distribution function is 0.5 (i.e., the energy level above which half of the charge carriers are expected to reside), by increasing the Fermi energy ($E_f$) such that it is at or near the barrier height (Δ), there are more electrons at or above the barrier height (Δ). As a result, cross-plane effective carrier density is increased, which in turn increases the ZT value for the thermoelectric material 42. The Fermi energy ($E_f$) may be approximately equal to the barrier height (Δ) or within a range of values near the barrier height (Δ). For example, the Fermi energy ($E_f$) may be set approximately equal to the barrier height (Δ), be within a range of the barrier height (Δ) plus or minus approximately 0.1*kT (where k is Boltzmann's constant and T is temperature in Kelvins), be within a range of the barrier height (Δ) minus approximately 0.1*kT, or the like.

FIG. 6 illustrates a thin film thermoelectric material 56 (hereinafter "thermoelectric material 56") having a high ZT value according to another embodiment of the present disclosure. This embodiment is substantially the same as that of FIG. 4. However, the thermoelectric material 56 is designed for use in a Thermoelectric Generator (TEG) rather than a TEC. The thermoelectric material 56 includes a heterostructure 58 formed of Group IV-VI semiconductor materials. The heterostructure 58 includes an alternating series of matrix material layers 60 and potential barrier material layers 62 (hereinafter "barrier material layers 62"). In order to operate as a potential barriers, the barrier material layers 62 have a bandgap that is greater than a bandgap of the matrix material layers 60, and are therefore referred to herein as being formed of a wide bandgap material. A resulting barrier height of the barrier material layers 62 is preferably in the range of and including 25 meV to 100 meV, but is not limited thereto. In the preferred embodiment, the matrix material layers 60 are PbSnSe, and the barrier material layers 62 are PbSe. However, other Group IV-VI semiconductor materials may be used. In this exemplary embodiment, the heterostructure 58 includes an initial matrix material layer 60-0 and an alternating series of barrier material layers 62-1 through 62-4 and matrix material layers 60-1 through 60-4. Note that in this exemplary embodiment, there are five matrix material layers 60-1 through 60-4, which are generally referred to herein as matrix material layers 60, and four barrier material layers 62-1 through 62-4, which are generally referred to herein as barrier material layers 62. However, the heterostructure 58 is not limited thereto. The heterostructure 58 may include any number of alternating matrix material layers 60 and barrier material layers 62 as long as the heterostructure 58 includes at least two barrier material layers 62.

In this embodiment, the thermoelectric material 56 is designed for operation in a TEG such that, during operation, a top surface 64 of the thermoelectric material 56 will be hot and a bottom surface 66 of the thermoelectric material 56 will be cold. As a result, the thermoelectric material 56 will have, or will experience, a corresponding temperature gradient 68. Thicknesses of the barrier material layers 62 are approximately equal to, or on the order of, the mean free paths of charge carriers between scattering events at corresponding temperatures in the temperature gradient 68 for the thermoelectric material 56. By letting the thicknesses of the barrier material layers 62 be approximately equal to the mean free paths for charge carriers between scattering events at the corresponding temperatures in the temperature gradient 68 of the thermoelectric material 56, ballistic transport of charge carriers across the barrier material layers 62 is enabled, thereby increasing the Seebeck coefficient of the thermoelectric material 42.

If the thermoelectric material 56 is N-type, the thickness ($t_{BLi}$) of the ith barrier material layer 62 in the thermoelectric material 56 is preferably defined as:

$$t_{BLi} \cong l^e_{mfp} = \frac{\mu_n}{q}\sqrt{3kT_i m^*_e}$$ (Eqn. 7)

where $T_i$ is the temperature (in Kelvins) in the temperature gradient 68 at a position of the ith barrier material layer 62 in the thermoelectric material 56, $\mu_n$ is the electron mobility of the barrier material layer 62 at temperature $T_i$, q is the charge of an electron, k is Boltzmann's constant, and $m_e^*$ is electron mass. Similarly, if the thermoelectric material 56 is P-type, the thickness ($t_{BLi}$) of the ith barrier material layer 62 in the thermoelectric material 56 is preferably defined as:

$$t_{BLi} \cong l^h_{mfp} = \frac{\mu_p}{q}\sqrt{3kT_i m^*_h}.$$ (Eqn. 8)

where $T_i$ is the temperature (in Kelvins) in the temperature gradient 68 at a position of the ith barrier material layer 62 in the thermoelectric material 56, $\mu_p$ is the electron mobility of the barrier material layer 62 at temperature $T_i$, q is the charge of an electron, k is Boltzmann's constant, and $m_h^*$ is hole mass. Depending on the material quality that can be obtained and the absolute temperatures in the thermoelectric material 56, the thicknesses of the barrier material layers 62 designed for high temperatures may be as thin as a few nanometers while barrier material layers 62 designed for low temperatures may be as thick as a 100 nanometers or more.

In addition, in this embodiment, a thickness of each of the matrix material layers 60 that is downstream of an adjacent barrier material layer 62 in the direction of charge carrier flow is greater than or equal to three times the thickness of the immediately preceding barrier material layer 62. More specifically, in this embodiment, the thickness ($t_{ML1}$) of the matrix material layer 60-1 is greater than or equal to three times the thickness ($t_{BL1}$) of the barrier layer 62-1, the thickness ($t_{ML2}$) of the matrix material layer 60-2 is greater than or equal to three times the thickness ($t_{BL2}$) of the barrier layer 62-2, the thickness ($t_{ML3}$) of the matrix material layer 60-3 is greater than or equal to three times the thickness ($t_{BL3}$) of the barrier layer 62-3, and the thickness ($t_{ML4}$) of the matrix material layer 60-4 is greater than or equal to three times the thickness ($t_{BL4}$) of the barrier layer 62-4. By letting the thicknesses ($t_{ML1}$ through $t_{ML4}$) of the matrix material layers 60-1 through 60-4 be greater than or equal to three times the thicknesses ($t_{BL1}$ through $t_{BL4}$) of the corresponding barrier material layers 62-1 through 62-4, charge carriers are allowed to relax thermally by scattering at least three times after passing through the barrier material layers 62-1 through 62-4. In other words, the charge carriers are allowed to reach a thermal equilibrium level. Note that the thickness of the matrix material layer 60-0 is not relevant with respect to allowing the charge carriers to relax thermally. As such, the thickness of the matrix material layer 60-0 may be any desired thickness.

It should be noted that in one embodiment, incorporation of quantum wells in the collector layers (e.g., the matrix material layers 60-1 through 60-4) can facilitate capture and thermalization of electrons due to electrophonon resonance associated with the subband degeneracy splitting effect. Quantum well incorporation can be useful since it would allow the collector layers to be thinner thus enabling more barrier material layers 62 with a given device structure thickness. A further benefit is that incorporating periodic quantum well layers will decrease lattice thermal conductivity because of increased phonon scattering associated with Umklapp processes. These as well as other variations and combinations of similar material design concepts are considered within the scope of this disclosure.

FIG. 7 is an exemplary energy band diagram for the thermoelectric material 56 of FIG. 6 according to one embodiment of the present disclosure. In this example, the thermoelectric material 56 is N-type. However, this discussion is also applicable for the case where the thermoelectric material 56 is P-type. In this embodiment, alloying of the barrier material layers 62, doping of the matrix material layers 60, or both is selected or controlled such that a Fermi energy ($E_f$) of the thermoelectric material 56 is at or near a barrier height ($\Delta$) of the barrier material layers 62. Since the Fermi energy ($E_f$) defines an energy level at which the Fermi-Dirac probability distribution function is 0.5 (i.e., the energy level above which half of the charge carriers are expected to reside), by increasing the Fermi energy ($E_f$) such that it is at or near the barrier height ($\Delta$), there are more electrons at or above the barrier height ($\Delta$). As a result, cross-plane effective carrier density is increased, which in turn increases the ZT value for the thermoelectric material 56. The Fermi energy ($E_f$) may be approximately equal to the barrier height ($\Delta$) or within a range of values near the barrier height ($\Delta$). For example, the Fermi energy ($E_f$) may be set approximately equal to the barrier height ($\Delta$), be within a range of the barrier height ($\Delta$) plus or minus approximately $0.1*kT$ (where k is Boltzmann's constant and T is temperature in Kelvins), be within a range of the barrier height ($\Delta$) minus approximately $0.1*kT$, or the like.

Figure 8A:
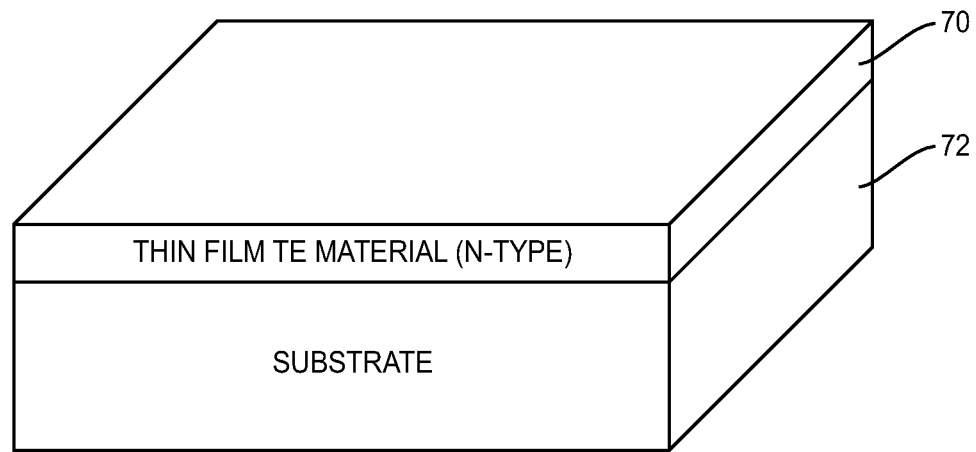

FIGS. 8A through 8G graphically illustrate a process for fabricating thermoelectric devices incorporating the thermoelectric material 32, 42, or 56 according to one embodiment of the present disclosure. First, as illustrated in FIG. 8A, a thin film N-type thermoelectric material 70 (hereinafter "N-type thermoelectric material 70") is grown on a substrate 72. The N-type thermoelectric material 70 is either the thermoelectric material 32 of FIG. 2, the thermoelectric material 42 of FIG. 4, or the thermoelectric material 56 of FIG. 5. The substrate 72 is preferably a silicon substrate. While not illustrated, one or more buffer layers may be formed between the substrate 72 and the N-type thermoelectric material 70, where, as discussed below, the one or more buffer layers function as release layers to allow removal of the substrate 72 from the N-type thermoelectric material 70. The one or more buffer layers may include or be a fluoride buffer layer such as a $BaF_2$ or $CaF_2$ buffer layer. The N-type thermoelectric material 70 may be grown on the substrate 72 using a suitable process such as, but not limited to, Molecular Beam Epitaxy (MBE), Metalorganic Vapor Phase Epitaxy (MOVPE), or Liquid Phase Epitaxy (LPE).

Figure 8B:
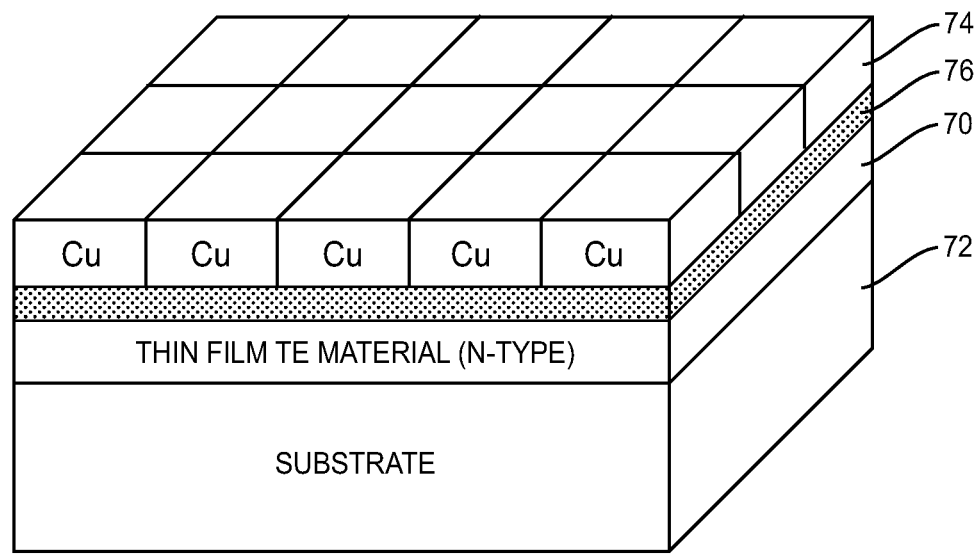

Next, as illustrated in FIG. 8B, copper blocks 74 are bonded to the N-type thermoelectric material 70 via bonding material 76. More specifically, the copper blocks 74 are preferably bonded to the N-type thermoelectric material 70 using eutectic bonding mellaurgy. The copper blocks 74 may be, for example, 0.5 mm×0.5 mm by 1.0 mm thick. The copper blocks 74 can be assembled on the surface of the N-type thermoelectric material 70 with high throughput pick-and-place automation and then bonded using established metallurgical bonding methods. For example, for high temperature power generation, Cu—Ag eutectic bonding may be used. Combined with thin diffusion barrier layers (i.e., Ta, Ti, Pd), the high eutectic liquidus temperature of 780 degrees Celsius for the Cu—Ag system allows reliable metallurgical contact with hot side temperatures as high as 600 degrees Celsius in solar concentrator applications, for example. In addition, the Cu—Ag has nearly optimal electrical and thermal conductivities, which enable realization of high power generation and heat pumping densities made possible by the thin film N-type thermoelectric material 70.

Figure 8C:
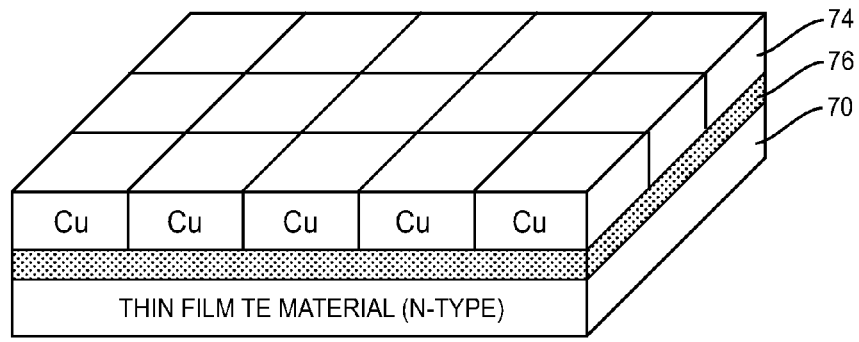
Figure 8D:
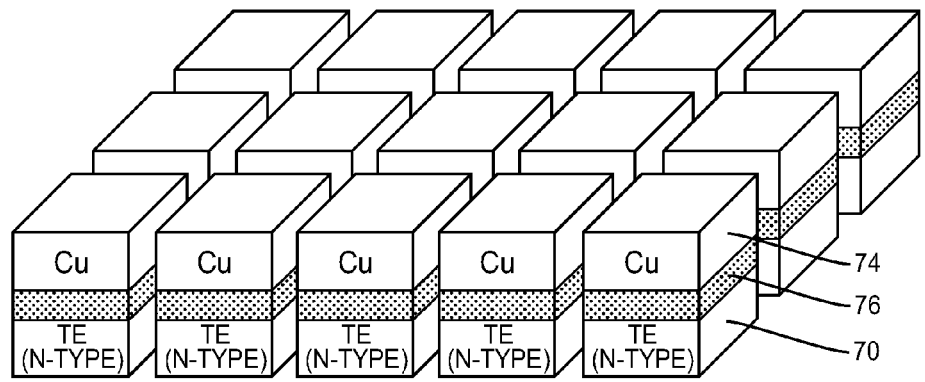
Figure 8E:
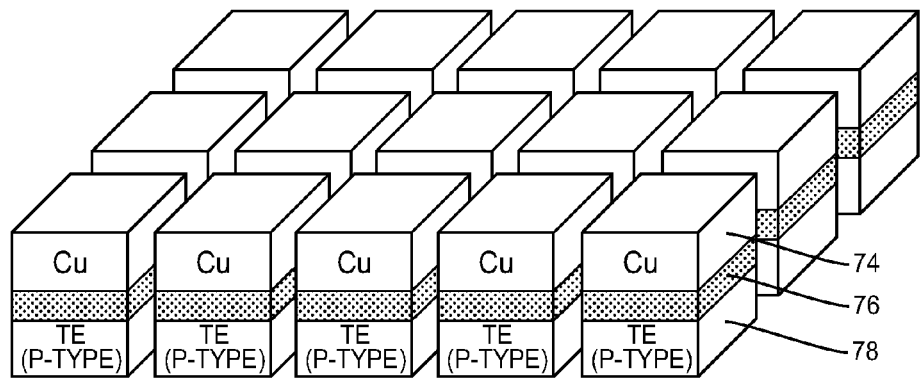
Figure 8F:
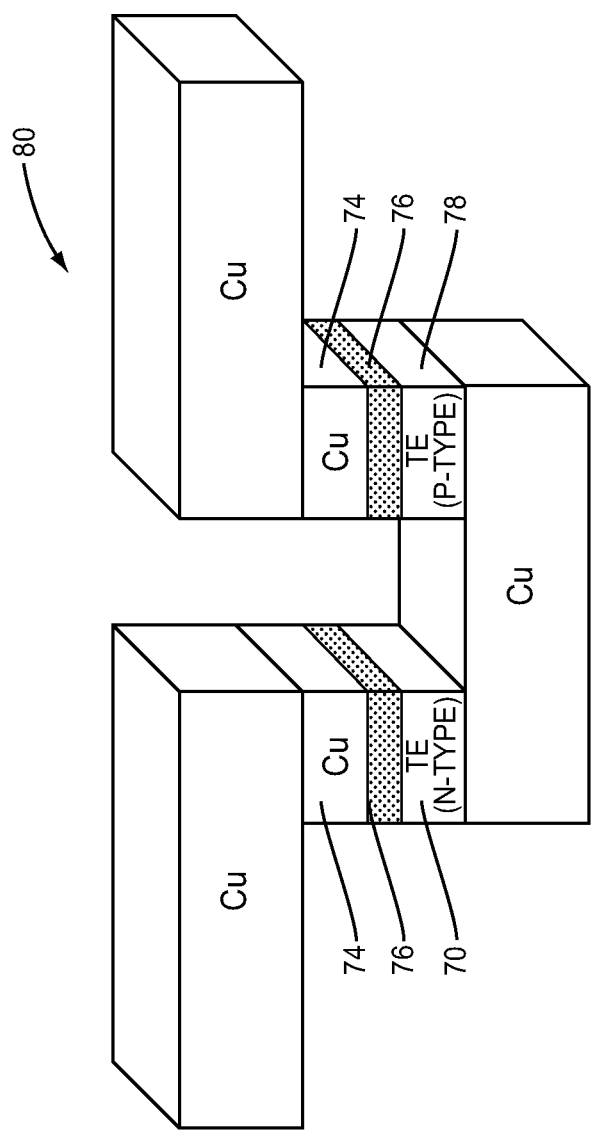
Figure 8G:
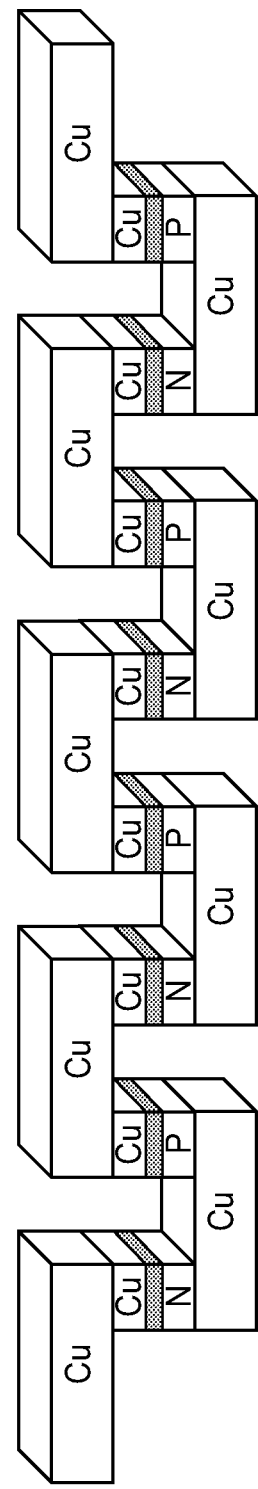

The substrate 72 is then removed from the N-type thermoelectric material 70, as illustrated in FIG. 8C. In one embodiment, one or more buffer layers between the substrate 72 and the N-type thermoelectric material 70 are dissolved to remove the substrate 72. For example, the one or more buffer layers may include or be a fluoride layer, and the fluoride layer may be dissolved in water to remove the substrate 72. The copper blocks 74 are then separated, as illustrated in FIG. 8D. This process is then repeated for P-type thermoelectric material 78, as illustrated in FIG. 8E. Lastly, as illustrated in FIG. 8F, one of the blocks of Cu and N-type thermoelectric material 70 of FIG. 8D and one of the blocks of Cu and P-type thermoelectric material 78 of FIG. 8E are assembled to form a two-leg thermoelectric device 80. In a similar manner, multiple blocks of Cu and N-type thermoelectric material 70 of FIG. 8D and multiple blocks of Cu and P-type thermoelectric material 78 of FIG. 8E may be assembled to form a multi-leg thermoelectric device 82, as illustrated in FIG. 8G.

The use of the thermoelectric material 32, 42, or 56, which includes a heterostructure including one or more potential barrier layers, increases the Seebeck coefficient of the thermoelectric material 32, 42, or 56 as compared to that of traditional thermoelectric materials. In addition, the use of IV-VI semiconductor materials reduces lattice thermal conductivity as compared to that of traditional thermoelectric materials. The increased Seebeck coefficient and reduced lattice thermal conductivity results in a high ZT value for the thermoelectric material 32, 42, or 56. In one embodiment, the ZT value for the thermoelectric material 32, 42, or 56 is greater than 3.0, which is predicted to enable TEGs to generate $300\ kW/m^2$ of power or more and to enable TECs to have cold side temperatures well below 200 Kelvins.

In addition, power generation and heat pumping densities both depend inversely on thermoelectric element (i.e., leg) thickness. Thinner elements are desired since the higher power generation and heat pumping densities of the thinner elements will allow similar performance with less material. So, in addition to using heterostructure designs to increase ZT, the thin film thermoelectric material 32, 42, or 56 described herein offers the benefit of significantly lower production costs since much less material is needed to get the same level of performance, i.e., thermoelectric chips get better, smaller, and cheaper.

Those skilled in the art will recognize improvements and modifications to the preferred embodiments of the present invention. All such improvements and modifications are considered within the scope of the concepts disclosed herein and the claims that follow.

What is claimed is:

1. A thermoelectric material comprising:
   a first matrix material layer formed of a IV-VI semiconductor material;
   a potential barrier material layer adjacent to the first matrix material layer and formed of a wide bandgap IV-VI semiconductor material; and
   a second matrix material layer adjacent to the potential barrier material layer opposite the first matrix material layer and formed of the IV-VI semiconductor material;
   wherein a Fermi energy of the thermoelectric material is within a predetermined range from a barrier height of the potential barrier material layer and the predetermined range is the barrier height of the potential barrier material layer plus or minus 0.1*kT, where k is Boltzmann's constant and T is temperature in Kelvins.

2. The thermoelectric material of claim 1 wherein a thickness of the second matrix material layer is equal to or greater than three times the thickness of the potential barrier material layer.

3. The thermoelectric material of claim 2 wherein the second matrix material layer is downstream from the potential barrier material layer in a direction of charge carrier flow when the thermoelectric material is incorporated into a thermoelectric device.

4. The thermoelectric material of claim 1 wherein the first and second matrix material layers are formed of PbSnSe and the potential barrier material layer is formed of PbSe.

5. The thermoelectric material of claim 1 wherein the first and second matrix material layers are formed of PbSnTe and the potential barrier material layer is formed of PbTe.

6. The thermoelectric material of claim 1 wherein the first and second matrix material layers are formed of PbSnSeTe and the potential barrier material layer is formed of PbSe.

7. The thermoelectric material of claim 6 wherein the first and second matrix material layers formed of PbSnSeTe and the potential barrier material layer formed of PbSe are lattice matched.

8. The thermoelectric material of claim 1 wherein a barrier height of the potential barrier material layer is in a range of and including 25 to 100 milli-electron-Volts.

9. A thermoelectric material comprising:
an initial matrix material layer; and
an alternating series of a plurality of potential barrier material layers formed of a wide bandgap semiconductor material and a plurality of matrix material layers formed of a semiconductor material;
wherein a Fermi energy of the thermoelectric material is within a predetermined range from a barrier height of the plurality of potential barrier material layers and the predetermined range is the barrier height of the plurality of the potential barrier material layers plus or minus 0.1*kT, where k is Boltzmann's constant and T is temperature in Kelvins.

10. The thermoelectric material of claim 9 wherein, for each matrix material layer of at least a subset of the plurality of matrix material layers, a thickness of the matrix material layer is greater than or equal to three times the thickness of one of the plurality of potential barrier material layers immediately preceding the matrix material layer in the alternating series of the plurality of potential barrier material layers and the plurality of matrix material layers.

11. The thermoelectric material of claim 9 wherein, for each matrix material layer of the plurality of matrix material layers, a thickness of the matrix material layer is greater than or equal to three times the thickness of one of the plurality of potential barrier material layers immediately preceding the matrix material layer in the alternating series of the plurality of potential barrier material layers and the plurality of matrix material layers.

12. The thermoelectric material of claim 9 wherein the initial matrix material layer, the plurality of potential barrier material layers, and the plurality of matrix material layers are IV-VI semiconductor materials.

13. The thermoelectric material of claim 9 wherein the initial matrix material layer and the plurality of matrix material layers are formed of PbSnSe and the plurality of potential barrier material layers are formed of PbSe.

14. The thermoelectric material of claim 9 wherein the initial matrix material layer and the plurality of matrix material layers are formed of PbSnTe and the plurality of potential barrier material layers are formed of PbTe.

15. The thermoelectric material of claim 9 wherein the initial matrix material layer and the plurality of matrix material layers are formed of PbSnSeTe and the plurality of potential barrier material layers are formed of PbSe.

16. The thermoelectric material of claim 15 wherein the initial matrix material layer and the plurality of matrix material layers are formed of PbSnSeTe and the plurality of potential barrier material layers are formed of PbSe is lattice matched.

17. The thermoelectric material of claim 9 wherein, for each potential barrier material layer of the plurality of potential barrier material layers, a barrier height of the potential barrier material layer is in a range of and including 25 to 100 milli-electron-Volts.

* * * * *